United States Patent
Huang

(10) Patent No.: US 6,232,203 B1
(45) Date of Patent: May 15, 2001

(54) PROCESS FOR MAKING IMPROVED SHALLOW TRENCH ISOLATION BY EMPLOYING NITRIDE SPACERS IN THE FORMATION OF THE TRENCHES

(75) Inventor: Kuei-Wu Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/360,119

(22) Filed: Jul. 23, 1999

(51) Int. Cl.$^7$ .................................. H01L 21/762
(52) U.S. Cl. ............................ 438/424; 438/701
(58) Field of Search .................... 438/424, 426, 438/427, 435, 437, 439, 701

(56) References Cited

U.S. PATENT DOCUMENTS

| | | | |
|---|---|---|---|
| 4,374,011 | * | 2/1983 | Vora et al. ................. 204/192.37 |
| 4,389,294 | * | 6/1983 | Anantha et al. ................. 438/701 |
| 5,229,316 | | 7/1993 | Lee et al. ................. 437/67 |
| 5,433,794 | | 7/1995 | Fazan et al. ................. 148/33.3 |
| 5,677,233 | | 10/1997 | Abiko ................. 437/67 |
| 5,733,383 | | 3/1998 | Fazan et al. ................. 148/33.3 |
| 5,763,315 | * | 6/1998 | Benedict et al. ................. 438/424 |
| 5,763,932 | | 6/1998 | Pan et al. ................. 257/510 |
| 5,801,082 | | 9/1998 | Tseng ................. 438/424 |
| 5,834,358 | | 11/1998 | Pan et al. ................. 438/424 |
| 6,033,968 | * | 3/2000 | Sung ................. 438/424 |
| 6,040,232 | * | 3/2000 | Gau ................. 438/424 |
| 6,063,694 | * | 3/2000 | Togo ................. 438/424 |
| 6,080,628 | * | 6/2000 | Cherng ................. 438/424 |

* cited by examiner

Primary Examiner—Olik Chaudhuri
Assistant Examiner—Anh Duy Mai
(74) Attorney, Agent, or Firm—George O. Saile; Stephen B. Ackerman

(57) ABSTRACT

A method is achieved for preventing oxide loss on the top corners of the isolation trenches and minimizing parasitic current leakage of the active devices on the substrate. The method consists of forming shallow trenches having either stepped or tapered walls in a silicon substrate using a pad oxide and silicon nitride mask. The dielectric material used to fill the trenches is then etched to form nitride spacers, which protect the top corners of the trench walls from subsequent etching but are removed prior to cleaning of the pad and forming of gate oxide around the trenches.

22 Claims, 6 Drawing Sheets

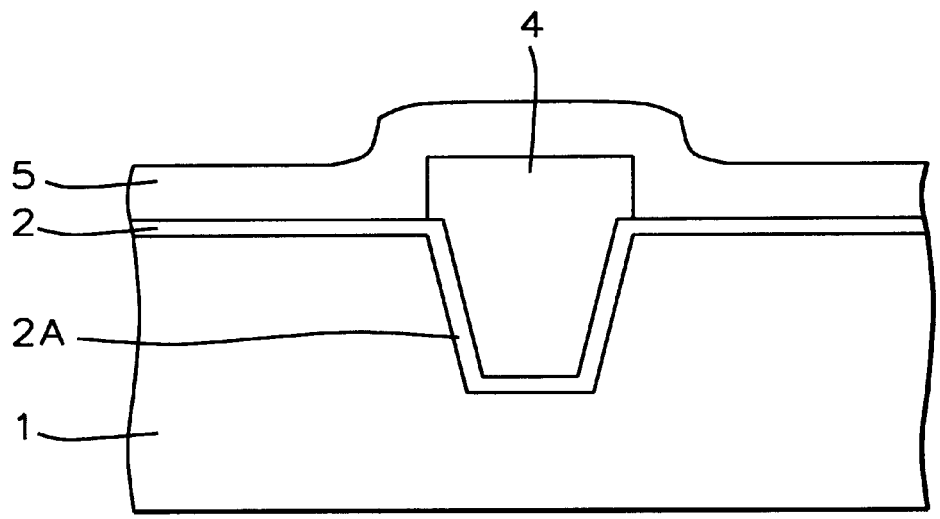
FIG. 1 – Prior Art
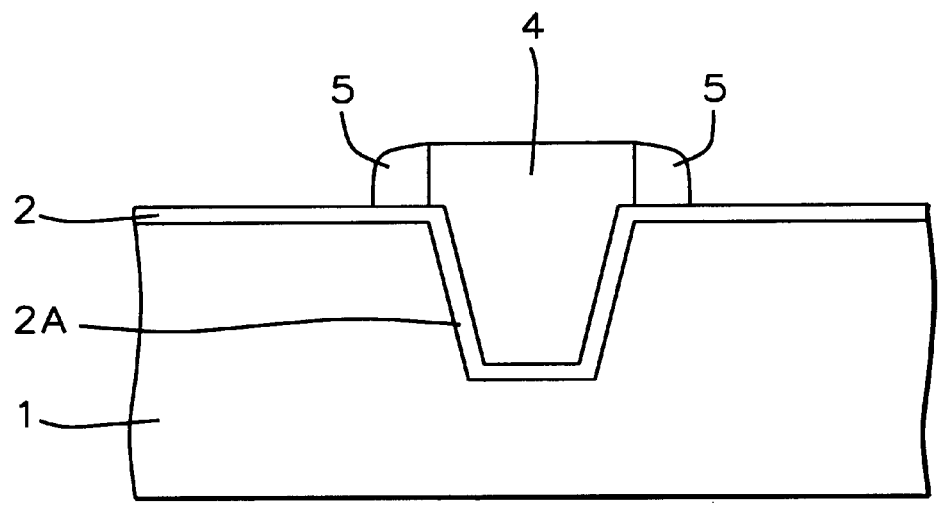
FIG. 2 – Prior Art

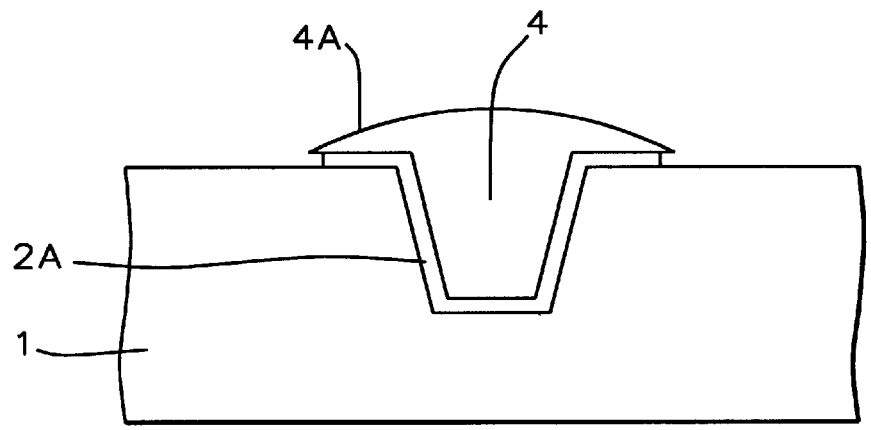
FIG. 3 — Prior Art
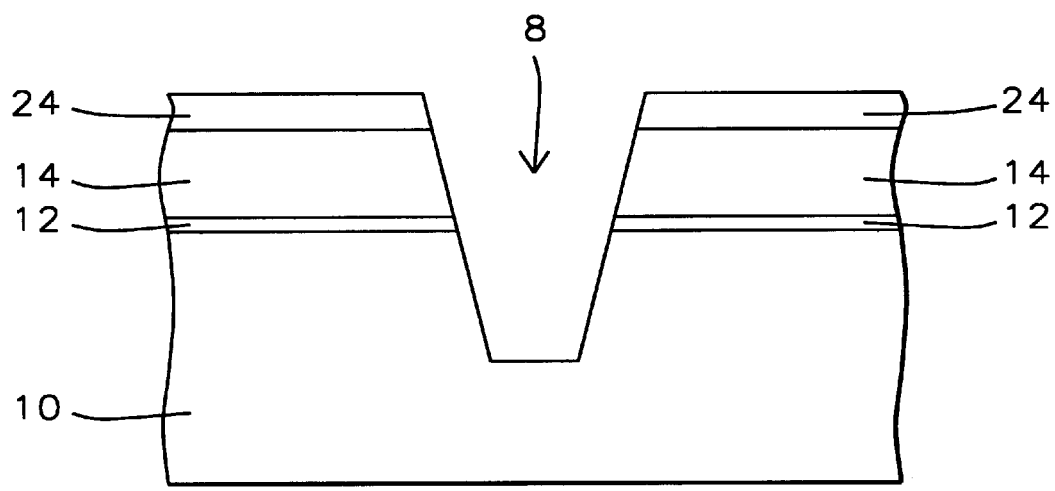
FIG. 4a

PROCESS FOR MAKING IMPROVED SHALLOW TRENCH ISOLATION BY EMPLOYING NITRIDE SPACERS IN THE FORMATION OF THE TRENCHES

FIELD OF THE INVENTION

The invention relates to the general field of semiconductor manufacture, in particular to the problem of oxide loss and parasitic current leakage at the upper corners of isolation trenches in substrates.

BACKGROUND OF THE INVENTION

In semiconductor manufacturing, as submicron device size has become increasingly common, Shallow Trench Isolation (STI), because of the greater density of devices that can be placed on a substrate and improved planarity, has proven superior to the Local Oxidation of Silicon (LOCOS) technology. However, one problem that exists with STI is the loss of oxide at the top inside corners of the isolation trenches, ultimately resulting in parasitic current leakage for the active devices disposed on the substrate.

One prior art method for solving the "corners" effect at the trench edge is taught by Fazan et al (U.S. Pat. Nos. 5,433,794; 5,733,383) whereby an isolating material extends over the edges of the trench. Referring to FIG. 1, an insulating layer 5 has been deposited over a semiconductor substrate 1 on which has been deposited a pad oxide layer 2 and which contains a trench lined with a thermal oxide 2a and filled with an isolating material 4. The spacers 5 shown in FIG. 2 result after a dry etching process, the spacers being located at the corners of the trench and having similar chemical properties to the isolation material 4. Referring to FIG. 3, a wet pad oxide etch causes the isolating material 4 to combine with the spacers 5 to form the cap 4a, which extends beyond the edges of the trench.

Certain other patents also address the subject of leakage at the upper corners of isolation trenches. For instance, Pan et al (U.S. Pat. Nos. 5,834,358; 5,763,932) teaches STI planarization processes using an etch back; Tseng (U.S. Pat. No. 5,801,082) planarizes an STI oxide using spin-on glass (SOG) spacers and an etch back; Abiko (U.S. Pat. No. 5,677,233) shows an STI planarization process that reduces oxide loss at trench corners using an oxide spacer; and Lee et al (U.S. Pat. No. 5,229,316) describes a process for forming an STI using a planarizing etch of a sacrificial layer. However, all of the etchback approaches from the prior art involve some kind of oxide deposition, either through chemical vapor deposition or spin-on, which adds to the complexity of the process. Moreover, oxide etchback processes will inevitably expose the substrate in the plasma, which can degrade the quality of the silicon substrate for subsequent device formation.

SUMMARY OF THE INVENTION

It is an object of the present invention to provide a process for shallow trench isolation.

A further object of the invention is to prevent oxide loss on the top corners of the trenches, and the parasitic current leakage of the active devices resulting therefrom, that is caused by multiple wet etch/cleaning steps in the manufacturing process.

These objects have been achieved by forming shallow trenches having either stepped or tapered side walls in a silicon substrate using a pad oxide and silicon nitride mask. The dielectric material used to fill the trenches is then etched to form nitride spacers, which protect the top corners of the trench walls from subsequent etching but are removed prior to cleaning of the pad oxide and forming of gate oxide around the trenches.

BRIEF DESCRIPTION OF THE DRAWINGS

FIG. 1 is a cross-section of the prior art of a trench lined with thermal oxide and filled with an isolation material in a substrate on which a layer of insulating material has been deposited.

FIG. 2 is also of the prior art and is the substrate of FIG. 1 with remnants of the insulating layer protecting the trench edges.

FIG. 3 is also of the prior art and is the substrate of FIG. 2 after partial combination of the insulating layer remnants with the isolation material in the trench.

FIG. 4a is a cross-section of a shallow trench having tapered sides in a substrate above the top surface of the silicon layer, using the process of the invention.

DESCRIPTION OF THE PREFERRED EMBODIMENTS

The method for making improved shallow trench isolation regions by employing nitride spacers in the formation of the trenches is now described in detail; it will be understood by those skilled in the art that the description is applicable to either N- or P-well substrates for forming N-channel or P-channel devices.

Exemplary embodiments of the invention are described with reference to FIGS. 4a–9.

Figure 4B:
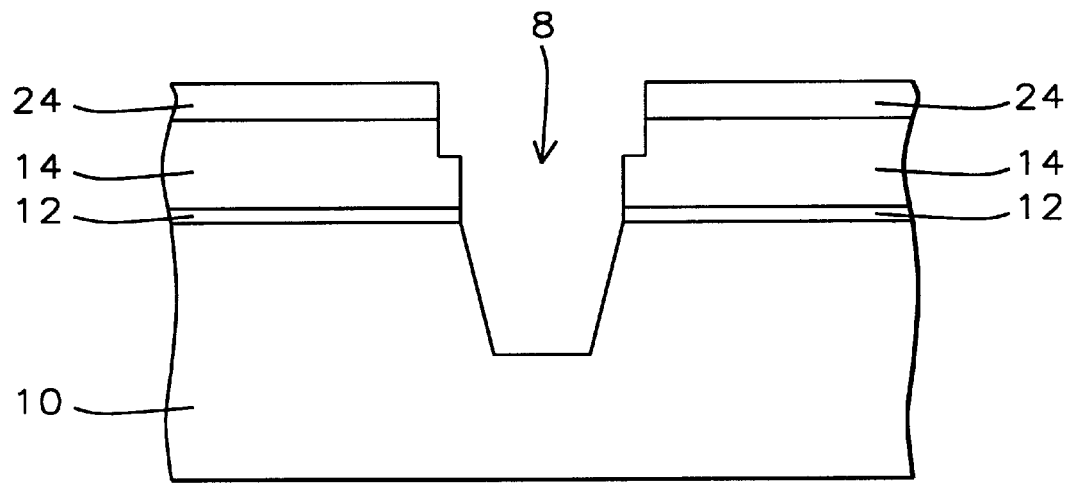
FIG. 4b is a variation of FIG. 4a, the difference being that the sides of the trench above said top surface are vertical.

Referring to FIGS. 4a and 4b, the process starts by providing a semiconductor substrate 10 (usually silicon), upon which a pad oxide layer 12 composed of silicon oxide ($SiO_2$) is formed as a stress relief layer, to a thickness between about 100 and 1000 Angstroms. A silicon nitride ($Si_3N_4$) layer 14 is then deposited on the pad oxide 12 in a thickness between about 1500 and 2500 Angstroms using, for example, Low Pressure Chemical Vapor Deposition (LPCVD); layer 14 serves as a disposable substance for forming the nitride spacers for the shallow trench isolation (STI).

Figure 5A:
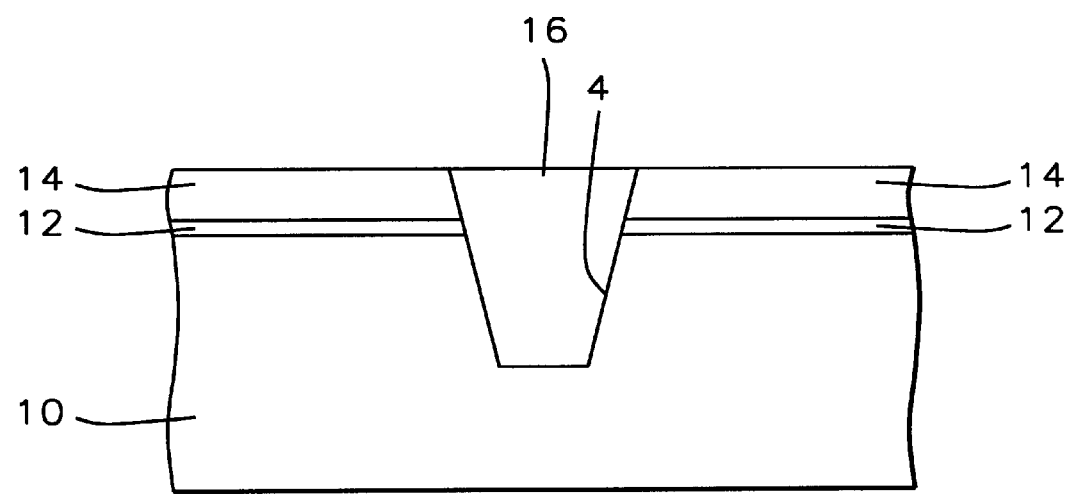
FIG. 5a is a cross-section of the shallow trench with tapered sides after removal of the photoresist mask and deposition of dielectric material in the trench.
Figure 5B:
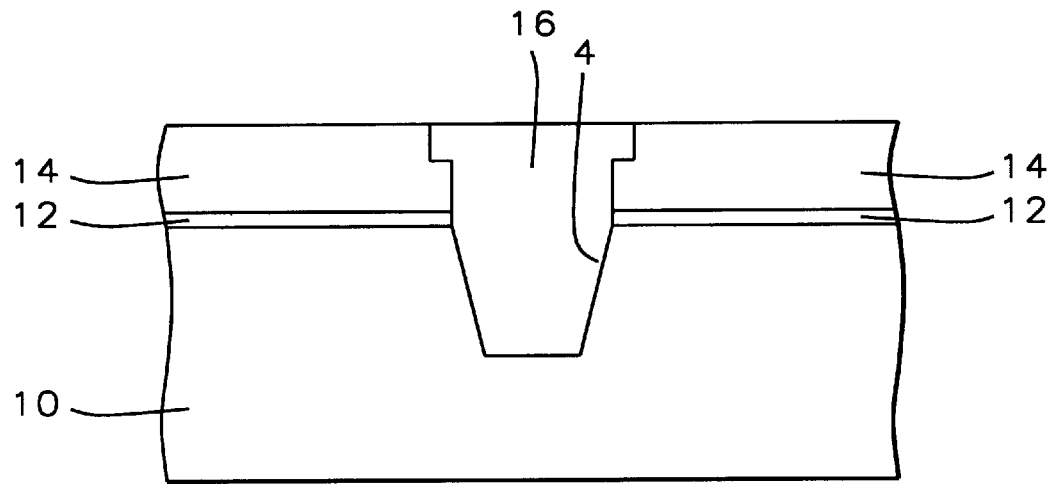
FIG. 5b is a variation of FIG. 5a showing the trench sides above the silicon substrate vertical.

Continuing to refer to FIGS. 4a and 4b, a photoresist mask 24 is deposited by spin coating and patterned by conventional photolithographic techniques to have openings 8 over the substrate where the shallow trenches are to be formed. Conventional plasma dry etching is then used to etch the $Si_3Ni_4$ layer 14 and pad oxide layer 12 to the surface of the silicon substrate 10, forming slightly tapered (5°–15°) or stepped (width=150–500 Angstroms, height=1000–1500 Angstroms) openings on the $Si_3Ni_4$ layer 14. Referring to FIGS. 5a and 5b, the photoresist mask 24 is removed by techniques well known to the art and the patterned $Si_3Ni_4$ layer 14 is used as an etch mask to etch trenches 4 in the silicon substrate using conventional dry etching methods that are known to the art. Once the trenches have been formed, they are overfilled with a dielectric material 16 such as $SiO_2$ (usually deposited by chemical vapor deposition, or CVD), following which the top part of the dielectric is removed by chemical/mechanical polishing (CMP), resulting in (1) a surface that is coplanar with the silicon and (2) trench side walls that are either tapered as in FIG. 5a or, alternatively, stepped as in FIG. 4b.

Figure 6A:
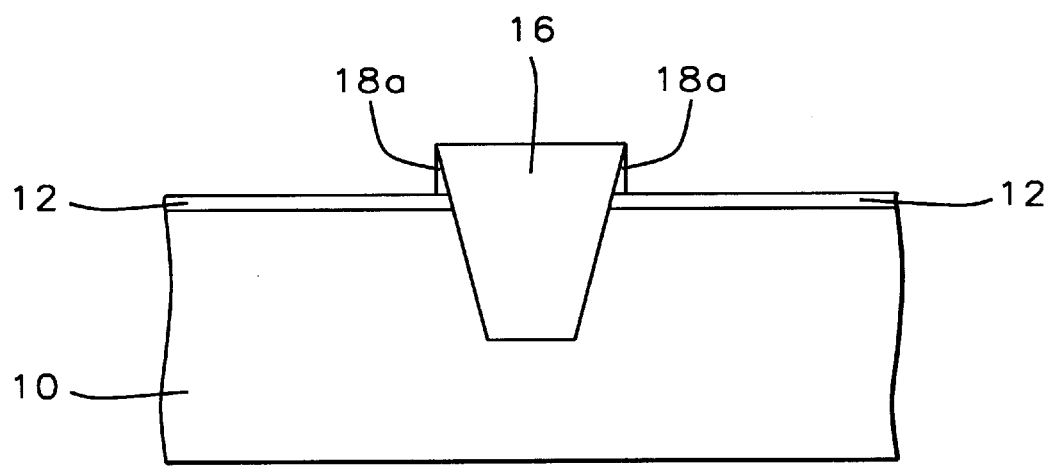
FIG. 6a shows the nitride spacers with tapered sides remaining after the silicon nitride, or top, layer of the substrate has been removed by etching.
Figure 6B:
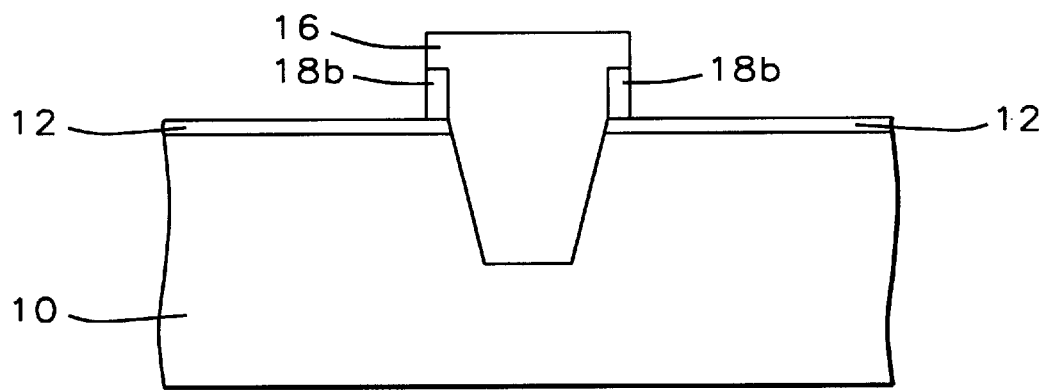
FIG. 6b is a variation of FIG. 6a showing the nitride spacers with vertical sides.

Next, in a key step of the invention, and referring to FIGS. 6a and 6b, the $Si_3N_4$ layer 14 is anisotropically etched away by a process selective to oxide comprising $SF_6$, as is known in the art, leaving nitride spacers 18a/18b along the side walls of the trench. Conversely, in the usual STI process, spacers are not normally formed.

Figure 7A:
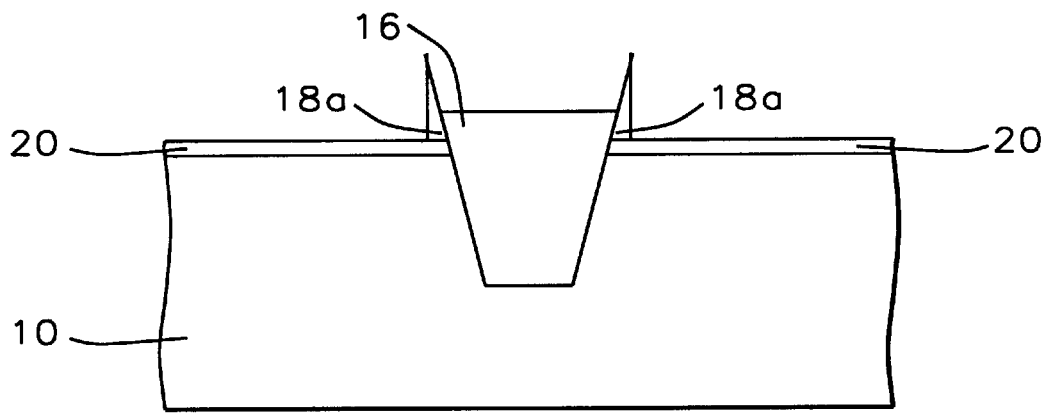
FIG. 7a depicts the tapered nitride spacers with the dielectric material in the trench partially removed by etching.
Figure 7B:
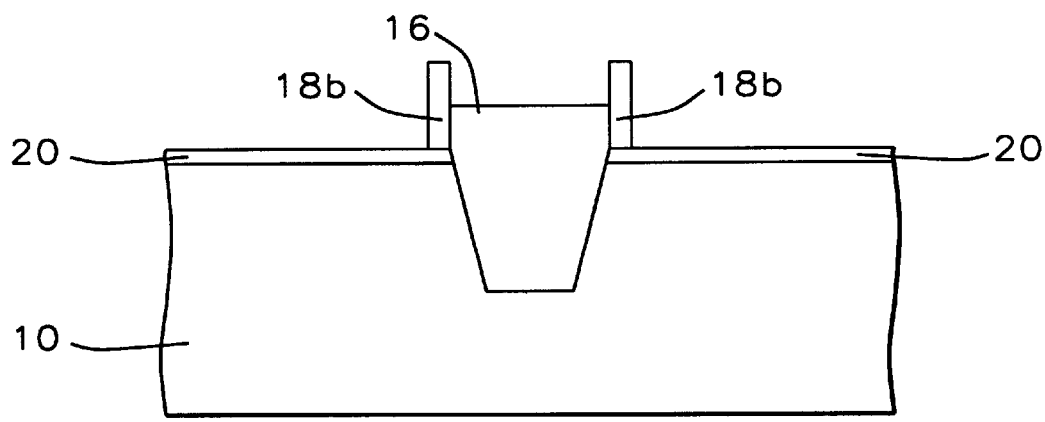
FIG. 7b is a variation of FIG. 7a showing the nitride spacers with vertical sides.
Figure 8A:
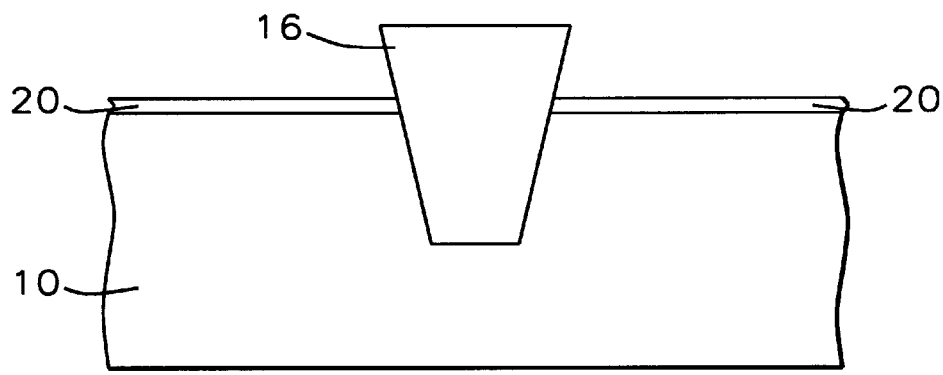
FIG. 8a depicts the dielectric trench material and pad oxide remaining after the removal of the nitride spacers.
Figure 8B:
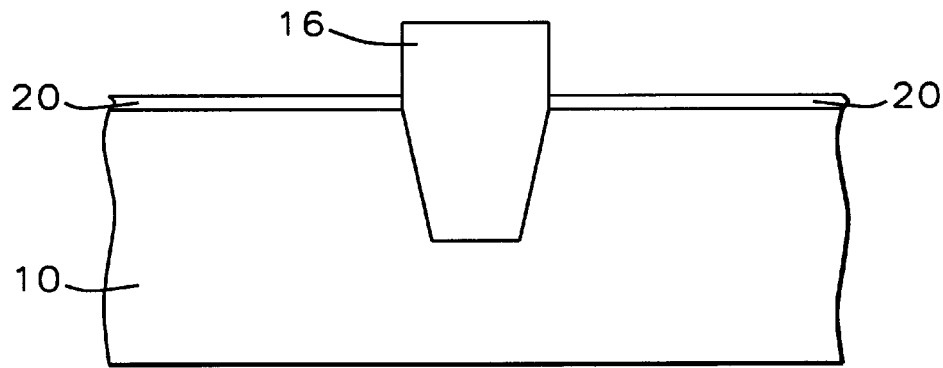
FIG. 8b is a variation of FIG. 8a showing the trench material and pad oxide with vertical sides.
Figure 9:
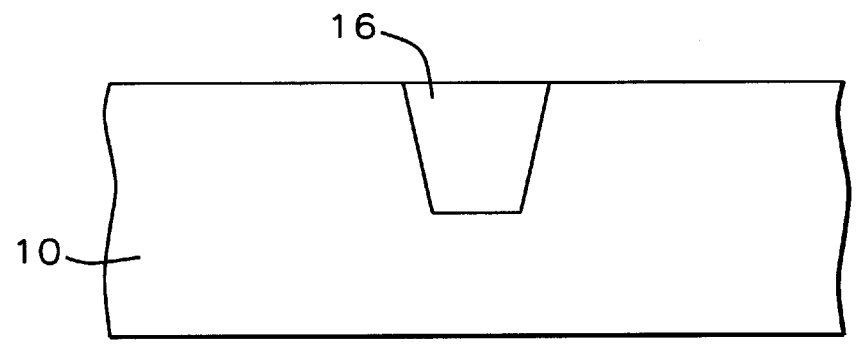
FIG. 9 shows the top of the dielectric trench material coplanar with the top of the silicon substrate after the wet etch of the dielectric material and removal of the sacrificial oxide layer.

Following the formation of the spacers 18a and 18b, the STI oxide 16 is wet-etched, removing the pad oxide 12 in the process, as shown in FIGS. 7a and 7b, using a dilute hydrofluoric acid (HF) or its equivalent (BOE, Vapor-HF, etc.) at room, or properly controlled, temperature. Then a first sacrificial thermal oxide 20 (50° to 150° A) is formed using thermal oxidation with $H_2O$ or $O_2$. Next, as depicted in FIGS. 8a and 8b, the nitride spacers 18a/18b are removed by a wet etch process using hot phosphoric acid. A properly selected wet etch is then done to remove layer 20 and the top part of layer 16 so that layer 16 will be flattened as shown in FIG. 9.

While the invention has been particularly shown and described with reference to the preferred embodiments thereof, it will be understood by those skilled in the art that various changes in form and details may be made without departing from the spirit and scope of the invention.

What is claimed is:

1. A process for silicon nitride spacer formation as part of shallow trench isolation (STI) formation in a device-containing semiconductor substrate, comprising steps of:

forming a pad oxide layer on the substrate;

depositing a layer of silicon nitride on the pad oxide layer;

patterning the silicon nitride and pad oxide layers to form an etching mask having openings with a tapered or a stepped side wall profile;

etching the semiconductor substrate exposed by the etching mask openings to form trenches in the semiconductor substrate;

overfilling the trenches and the profiled silicon nitride mask openings with a dielectric material;

planarizing the surfaces of the dielectric material and the silicon nitride layer;

forming silicon nitride spacers, conformal to the stepped or tapered dielectric material, by anisotropically etching the silicon nitride layer away from the surface of the pad oxide layer;

removing the pad oxide layer and at least a portion of the dielectric material, wherein the silicon nitride spacers protect the corners of the dielectric material in the trenches.

2. The process of claim 1 wherein the layer of pad oxide is formed to a thickness between about 100 and 1000 Angstroms.

3. The process of claim 1 wherein the layer of silicon nitride is formed to a thickness between about 1500 and 2500 Angstroms.

4. The process of claim 1 wherein the step of depositing a layer of silicon nitride is accomplished using LPCVD.

5. The process of claim 1 wherein the trenches are formed to a width between about 3000 and 6000 Angstroms.

6. The process of claim 1 wherein the trenches are formed to a depth between about 3000 and 6000 Angstroms.

7. The process of claim 1 wherein the side walls of the trenches are formed at an angle of 50°–15° from the vertical.

8. The process of claim 1 wherein the nitride spacers are formed to a width between about 150 and 500 Angstroms.

9. The process of claim 1 wherein the nitride spacers are formed to a depth between about 1000 and 1500 Angstroms.

10. The process of claim 1 wherein the step of removing the pad oxide layer and dielectric material further comprises wet etching with dilute HF at about room temperature.

11. A process of shallow trench isolation (STI) formation in a device-containing semiconductor substrate, using silicon nitride spacer formation for limiting oxide loss along dielectric-filled trenches, comprising the steps of:

forming a pad oxide layer on the substrate;

depositing a layer of silicon nitride on the pad oxide;

patterning the silicon nitride and pad oxide layers to form an etching mask having openings with a tapered or a stepped side wall profile;

etching the semiconductor substrate exposed by the etching mask openings to form trenches in the semiconductor substrate;

overfilling the trenches and the profiled silicon nitride mask openings with a dielectric material;

planarizing the surfaces of the dielectric material and the silicon nitride layer;

forming silicon nitride spacers, conformal to the stepped or tapered dielectric material, by anisotropically etching the silicon nitride layer away from the surface of the pad oxide;

removing the pad oxide layer and at least a portion of the dielectric material by wet etching, wherein the nitride spacers protect the corners of the dielectric material in the trenches;

forming a sacrificial thermal oxide layer on the semiconductor substrate by a re-oxidation process;

removing the nitride spacers by wet etching; and etching the dielectric material and the sacrificial thermal oxide layer, whereby the sacrificial thermal oxide layer is removed and the dielectric material top surface is flattened.

12. The process of claim 11 wherein the layer of pad oxide is formed to a thickness between about 100 and 1000 Angstroms.

13. The process of claim 11 wherein the layer of silicon nitride is formed to a thickness between about 1500 and 2500 Angstroms.

14. The process of claim 11 wherein the step of depositing a layer of silicon nitride is accomplished using LPCVD.

15. The process of claim 11 wherein the trenches are formed to a width between about 3000 and 6000 Angstroms.

16. The process of claim 11 wherein the trenches are formed to a depth between about 3000 and 6000 Angstroms.

17. The process of claim 11 wherein the side walls of the trenches are formed at an angle of 5°–15° from the vertical.

18. The process of claim 11 wherein the nitride spacers are formed to a width between about 150 and 500 Angstroms.

19. The process of claim 11 wherein the nitride spacers are formed to a depth between about 1000 and 1500 Angstroms.

20. The process of claim 11 wherein the step of etching the pad oxide layer and dielectric material further comprises wet etching with dilute HF at about room temperature.

21. The process of claim 11 wherein the forming of the sacrificial thermal oxide layer is by a re-oxidation process using thermal oxidation with $H_2O$ or $O_2$.

22. The process of claim 11 wherein the removal of the nitride spacers by wet etching further comprises using hot phosphoric acid.

* * * * *